United States Patent [19]

Feuerbaum

[11] 4,413,181
[45] Nov. 1, 1983

[54] ARRANGEMENT FOR STROBOSCOPIC POTENTIAL MEASUREMENTS WITH AN ELECTRON BEAM TESTING DEVICE

[75] Inventor: Hans-Peter Feuerbaum, Munich, Fed. Rep. of Germany

[73] Assignee: Siemens Aktiengesellschaft, Berlin & Munich, Fed. Rep. of Germany

[21] Appl. No.: 287,134

[22] Filed: Jul. 27, 1981

[30] Foreign Application Priority Data

Sep. 29, 1980 [DE] Fed. Rep. of Germany ....... 3036660

[51] Int. Cl.³ .......................................... G01N 23/00
[52] U.S. Cl. ................................ 250/310; 324/158 D
[58] Field of Search ............... 250/310, 311, 306, 307; 324/158 D

[56] References Cited

U.S. PATENT DOCUMENTS

| 4,063,091 | 12/1977 | Gee ..................................... 250/310 |
| 4,220,853 | 9/1980 | Feuerbaum et al. ................. 250/310 |
| 4,220,854 | 9/1980 | Feuerbaum ......................... 250/310 |
| 4,223,220 | 9/1980 | Feuerbaum ......................... 250/310 |

OTHER PUBLICATIONS

*J. Phys. E: Sci. Instrum.*, vol. 11, 1978, Article entitled "A Sampling Scanning Electron Microscope", at pp. 229–233, Gopinathan et al., and also article entitled Beam Chopper for Subnanosecond Pulses in Scanning Electron Microscopy, at pp. 529–532, Feuerbaum et al.

*Primary Examiner*—Bruce C. Anderson
*Attorney, Agent, or Firm*—Hill, Van Santen, Steadman & Simpson

[57] ABSTRACT

An electron beam testing device system for stroboscopic potential measurements of a test subject utilizes a scanning electron microscope having a beam suppression or blanking system. The blanking system deflects the electron beam across an aperture during each edge of a blanking pulse connected to control the blanking system so that two electron pulses are generated for each blanking pulse. A detector produces a signal responsive to a secondary electron beam resulting from impact of each of the electron pulses on the test subject. A signal processing unit with an associated gate circuit all preferably incorporated in a boxcar integrator processes only one of the two electron pulses associated with each blanking pulse. A phase control preferably within the boxcar integrator is connected to control the gate circuit and a blanking pulse generator for producing the blanking pulse.

4 Claims, 4 Drawing Figures

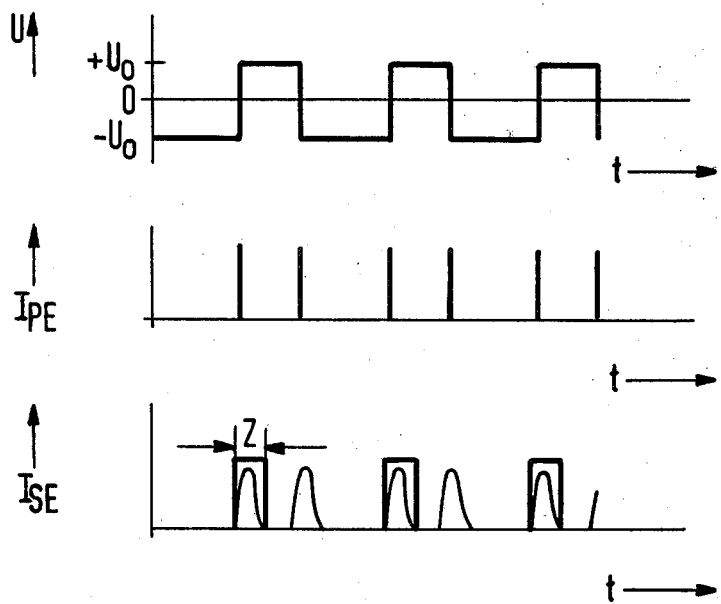

ARRANGEMENT FOR STROBOSCOPIC POTENTIAL MEASUREMENTS WITH AN ELECTRON BEAM TESTING DEVICE

BACKGROUND OF THE INVENTION

The invention relates to an arrangement for stroboscopic potential measurements with an electron beam measuring or testing device which exhibits a beam suppression blanking system, and in which the electron beam is deflected across an aperture or diaphragm during each edge of a sampling pulse such that two electron pulses are generated for each sampling pulse.

High frequency signal paths can be stroboscopically measured with an electron beam testing device. Accordingly, a finely focused electron beam which is directed onto the measuring subject, for example an integrated circuit, serves as the test probe. Due to the interaction between electrons and solid bodies, secondary electrons among other things are released which can be employed for imaging an object. These secondary electrons also carry information concerning the electrical potential at the location of incidence. Upon exploitation of the stroboscopic effect, specimens or subjects being tested functioning with a high nominal frequency can also be quasi-statically imaged as a potential contrast. For this purpose, the measuring subject to be examined is targeted with cyclically repeating signals and is imaged in a scanning electron microscope. The electron beam is turned on only once for a brief time in each cycle, i.e. the measuring subject is only observed during a specific phase. Thus, the imaging is a snapshot of the rapidly functioning probe. The point in time at which the electron beam is switched on can be selected at random within the cycle. Slowmotion presentation of the switching operations is possible by means of slowly shifting the phase. The on-time duration of the electron beam can be reduced down to the picosecond range, i.e. the chronological resolution of said imaging method lies in the picosecond range. The electron range are generated with the assistance of a beam suppression or blanking system.

A purpose of the device disclosed herein is to generate the electron pulses and to process the secondary electron pulse signals.

In order to generate short electron pulses, deflection structures (plate capacitors, traveling wave arrangements) which deflect the electron beam from the beam path onto a diaphragm or aperture were previously employed. There are fundamentally two possibilities for the drive of the deflection structures. According to method I (the arrangement specified by H. P. Feuerbaum and J. Otto in J. Phys. E: Sci. Instrum., Vol. 11, 1978, 529–532, incorporated herein by reference, and which can be employed for this purpose), one deflection structure is grounded, whereas a constant voltage is applied to the other deflection structure. A blanking pulse superimposed on the constant voltage places the deflection structure at grounded potential. During the blanking pulse, the space between the two deflection structures is field-free, so that the electron beam is switched on. In this method, the electron pulse width is determined by the width of the blanking pulse applied. The smallest electron pulse width hitherto attainable amounts to 350 ps.

According to method II (K. G. Gopinathan, A. Gopinath, "A Sampling Scanning Electron Microscope", J. Phys. E: Sci. Instrum., Vol. II, 1978, 229–233, incorporated herein by reference, shorter pulse widths ($\approx 10$ ps) are achieved when one deflection structure is grounded, whereas a negative constant voltage $-U_o$ is applied to the other. A blanking pulse superimposed on the constant voltage places this deflection structure approximately at the potential $+U_o$. Therefore, the electron beam is deflected across a diaphragm or aperture during each edge of a blanking pulse. In accordance with the rising edge and falling edge, the circuitry supplies two electron pulses per blanking pulse.

Since a stroboscopic measurement, however, requires one electron pulse per signal cycle with which the test subject is driven, this wiring is only suitable when (a) one of the two electron pulses is deflected out of the beam path by means of an additional beam blanking system; that, however, is only possible at great mechanical and electronic expense.

(b) two respectively successive electron pulses have the same chronological spacing with respect to one another and the frequency of the signal with which the test subject is cyclically driven is twice as high as the frequency of the blanking pulse. In this method, however, a high chronological resolution can be achieved only after a protracted adjustment of the spacing of the two electron pulses.

SUMMARY OF THE INVENTION

An object of the invention is to provide an arrangement for stroboscopic potential measurements with an electron beam testing device which renders possible a high chronological resolution without additional expense with respect to the signal processing or with respect to the beam suppression or blanking system.

This object is inventively achieved in that the testing device of the invention employs a signal processing device with a gate circuit which, for each blanking pulse, only measures the signal caused by one electron pulse. Thus, in the signal processing, a chronological window is placed in such manner that only the signal of one electron pulse is measured per blanking pulse. A boxcar integrator is advantageously employed for such a signal processing device.

The inventive arrangement can advantageously be switched between the aforementioned operating modes according to a first method I (FIG. 2, hereafter) and according to a second method II (FIG. 3 hereafter) in a simple manner.

BRIEF DESCRIPTION OF THE DRAWINGS

FIG. 4 shows the principle of the stroboscopic potential measurement in an arrangement according to the invention.

DESCRIPTION OF THE PREFERRED EMBODIMENTS

Figure 1:
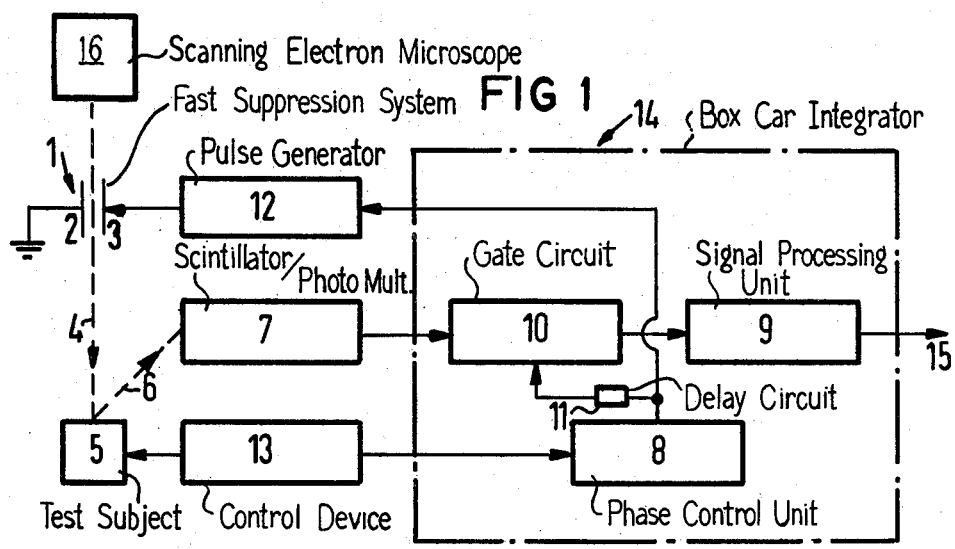
FIG. 1 shows an inventive arrangement for stroboscopic potential measurements with an electron beam measuring or testing device.

In FIG. 1, an inventive arrangement for stroboscopic potential measurements with an electron beam measuring device is illustrated. An electron beam measuring device according to the cited prior art which is to be inventively modified can be employed as the basis for an inventive arrangement. The basic unit forms a modified scanning electron microscope 16 with a fast beam suppression system 1. This beam suppression or blanking system 1 exhibits the two deflection structures 2, 3. In order to be able to stroboscopically measure the high-frequency periodic events in the test object or subject 5, an electron beam 4 of primary electrons is pulsed synchronously with the event, so that it strikes the test object 5 only during a specific phase of the high-frequency periodic event. The potential in this phase of the high-frequency periodic event is determined with the assistance of a spectrometer from the energy of the secondary electrons 6 which are released in pulse-shaped form. For this purpose, the signal of the secondary electrons 6 which have passed through the spectrometer are amplified in a scintillator/photomultiplier combination 7.

Accordingly, a modified boxcar integrator 14 assumes the control of the phase and the signal processing. A boxcar integrator is an amplifier which samples high-frequency signals with a time window (gate) according to the sampling principle. The boxcar integrator 14 exhibits a phase control unit 8, a signal processing unit 9, and a gate circuit 10. After amplification in the scintillator/photomultiplier combination 7, the signal of the secondary electrons 6 arrives at the input of the gate circuit 10. The values measured at a specific phase during the high-frequency periodic operation in the test subject 5 are integrated in the signal processing unit 9 and are subsequently amplified. For employment in electron beam testing or measuring technology, the following change must be carried out at the boxcar integrator 14: a delay circuit 11 (approximately 150 ns) is built in between the phase control unit 8 and the gate circuit 10. Without delay, the phase control unit 8 drives the pulse generator 12 of the beam suppression system 1. The signal of the emitted secondary electrons 6, as a result of the transit time of the primary electrons 4, appears with a delay at the input of the gate circuit 10. At the same time, when the signal of the emitted secondary electrons 6 appears at the input of the gate circuit 10, the gate circuit is driven via the built-in delay circuit 11 in such manner that the signal of the secondary electrons 6 is amplified. The boxcar integrator supplies a signal 15 which is proportional to the signal level of the secondary electrons 6. The overall arrangement also exhibits an electronic auxiliary control device 13 for the drive of the test subject 5 and for the drive of the phase control unit 8 in correspondence thereto. Such a device is well known to those skilled in this art.

Figure 2:
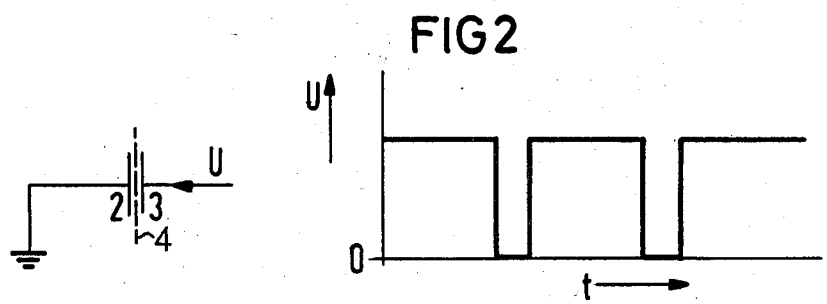
FIG. 2 shows the circuitry of a beam suppression or blanking system according to method I.

FIG. 2 shows the circuitry and applied voltages of a beam suppression system 1 according to the aforementioned method I. The deflection structure 2 is grounded, whereas a constant voltage is applied to the deflection structure 3. A blanking pulse superimposed on said constant voltage places said deflection structure 3 at ground potential. During the blanking pulse, the space between the deflection structures 2, 3 is field-free, so that the primary electron beam 4 is switched on. The electron pulse width in this method is determined by the width of the blanking pulse applied. The smallest pulse width previously attained amounts to 350 ps.

Figure 3:
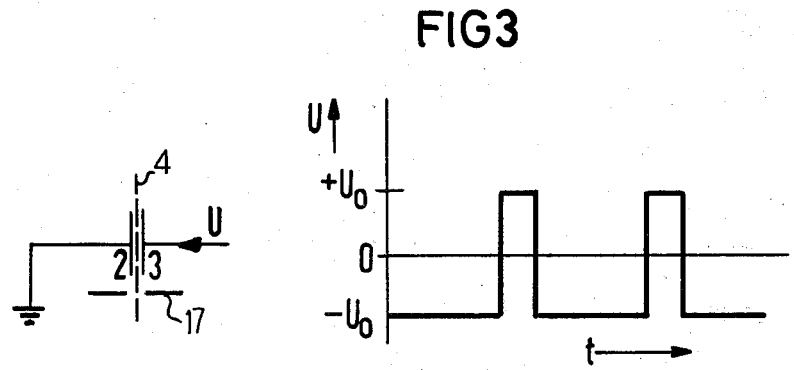
FIG. 3 shows the circuitry of a beam suppression system according to method II.

FIG. 3 shows the circuitry and applied voltages of a beam suppression system 1 according to the aforementioned method II as employed in this invention. The deflection structure 2 is again grounded, whereas a negative constant voltage $-U_o$ is applied to the deflection structure 3. A blanking pulse superimposed on said constant voltage places said deflection structure 3 at the potential $+U_o$. During each edge of a blanking pulse, the electron beam 4 is deflected across a diaphragm or aperture 17. In accordance with the rising edge and falling edge of each individual blanking pulse, this system supplies two primary electron pulses 4 per blanking pulse. With this system, shorter pulse widths can be achieved ($\approx 10$ ps).

FIG. 4 shows the principle of the stroboscopic potential measurement with an arrangement according to the invention. The deflection structures 2, 3 are wired according to the method II (FIG. 3) so that two electron pulses 4 are generated per period of the high-frequency periodic event in the test subject 5. In the signal processing unit 9, a chronological window Z is established in such manner that only the signal of a single secondary electron pulse is measured per period of the high-frequency periodic event in the test subject 5.

FIG. 4 shows the voltage U applied to the deflection structure, the pulsed primary electron current $I_{PE}$ generated therewith, the pulsed beam current $I_{PE}$ of the primary electrons 4 generated by means of the voltage U at the beam suppression system 1, and the pulsed beam current $I_{SE}$ of the secondary electrons 6 which results. This signal (current $I_{SE}$) arrives at the gate circuit 10 with a delay as a result of the transit time of the primary electrons 4.

In comparison to the known arrangements, the inventive arrangement has the advantage that one can switch, in a simple manner, between the operating modes according to method I and according to method II by simply providing a switching circuit in the pulse generator for applying the potential shown in FIG. 2 rather than FIG. 3. The device Model 162 of the PAR company was employed as the boxcar integrator having the above described gate circuit, signal processing unit, and phse control unit therein.

In the previously cited article "Electron-Beam Testing of VLSI Circuits", IEEE of Solid-State Circuits, 471–481, in FIG. 5 of this reference, there are described the peripheral accessories required for the stroboscopic voltage contrast mode and for the sampling mode according to this invention. In reference 20 of this cited article, (H. P. Feuerbaum et al, "Beam Chopper For Subnano-Second Pulses In Scanning Electron Microscopy", J. Phys. E: Sci Instr., Vol. 11, 1978, 529–532), an appropriate beam chopper system (pulse generator 12 and suppression system 1) as well as an appropriate electronic device 13 are described.

In a preferred embodiment, as the electron microscope 16, a modified ETEC autoscan scanning electron microscope may be employed with a large-area specimen chamber in which a printed-circuit board has been placed on the x,y stage (P. Fazekas et al, "On-Wafer Defect Classification of LSI-Circuits Using A Modified SEM", SEM/1978/801-806), the test subject 5 under test is inserted in a socket on this board, which is implemented as a personality card for each test subject (such as an integrated circuit) to be inspected. Coaxial cables run from the printed-circuit board through coaxial vacuum feedthroughs to a second printed-circuit board, which is likewise provided with line drivers. Connected to the second circuit board is a HP Microprocessor-lab 5036A as the control device 13 which drives the test subject 5 under test. Located above the microprocessor under test is the electron spectrometer for voltage measurements (H. P. Feuerbaum "VLSI Testing Using The Electron Probe", SEM/1979/I, SEM INC. AMF O-Hare, IL6066 (1979), 285–296).

The inventive arrangement can also be additionally operated with symmetrically wired deflection structures 2,3, as is described by H. P. Feuerbaum and J. Otto in the above cited publication. During blocking operation, the one deflection structure then lies at the potential $+U_o$, whereas the other deflection structure lies at the potential $-U_o$. The primary electron beam 4 is switched since the deflection structures 2, 3 have applied thereto a zero potential by the blanking pulse.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. An electron beam testing device system for stroboscopic potential measurements of a test subject, comprising: a scanning electron microscope having a beam suppression or blanking system in which an electron beam is deflected across an aperture in the blanking system during each edge of a blanking pulse connected to control the blanking system such that two electron pulses are generated per blanking pulse; blanking pulse generator means for producing said blanking pulse; detector means for producing a signal responsive to a secondary electron beam resulting from impact of each of the electron pulses on the test subject on which the potential measurements are being made; a signal processing means with an associated gate circuit for processing only the signal associated with one of said two electron pulses associated with each blanking pulse; and phase control means connected to control said gate circuit and said blanking pulse generator means.

2. A system according to claim 1 wherein the signal processing means with its associated gate circuit comprises a portion of a boxcar integrator.

3. A system according to claim 1 wherein a switching means is associated with said pulse generator means for selectively providing said blanking pulse with different reference potentials such that said blanking system produces either said two electron pulses for each side edge of the blanking pulse or one of electron pulse corresponding to a width of the blanking pulse.

4. A system according to claim 1 wherein the blanking system includes a first deflection plate which is connected to a reference potential and a second deflection plate connected to receive said blanking pulse.

* * * * *